(12) United States Patent
Good et al.

(10) Patent No.: US 7,908,109 B2
(45) Date of Patent: Mar. 15, 2011

(54) IDENTIFYING MANUFACTURING DISTURBANCES USING PRELIMINARY ELECTRICAL TEST DATA

(75) Inventors: Richard P. Good, Austin, TX (US); Lothar Waetzold, Dresden (DE); Thomas Depaly, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 273 days.

(21) Appl. No.: 12/169,267

(22) Filed: Jul. 8, 2008

(65) Prior Publication Data
US 2010/0010768 A1    Jan. 14, 2010

(51) Int. Cl.
*G01R 31/26* (2006.01)
*G06F 11/26* (2006.01)

(52) U.S. Cl. ........ 702/117; 702/118; 702/120; 700/121; 438/14; 438/17

(58) Field of Classification Search ................... 702/117, 702/118, 120
See application file for complete search history.

(56) References Cited

U.S. PATENT DOCUMENTS

| | | | |
|---|---|---|---|
| 6,622,059 B1* | 9/2003 | Toprac et al. | 700/121 |
| 7,062,415 B2* | 6/2006 | Whitefield et al. | 702/194 |
| 7,339,388 B2* | 3/2008 | Aghababazadeh et al. | 324/763 |
| 2004/0040001 A1 | 2/2004 | Miller et al. | 716/4 |
| 2004/0093107 A1* | 5/2004 | Good et al. | 700/108 |
| 2006/0167651 A1* | 7/2006 | Zangooie et al. | 702/179 |

\* cited by examiner

*Primary Examiner* — Hal D Wachsman
(74) *Attorney, Agent, or Firm* — Williams, Morgan & Amerson, P.C.

(57) ABSTRACT

A method includes receiving measured values for a plurality of electrical test parameters associated with integrated circuit devices on at least one wafer measured prior to completion of the wafer. Values of the electrical test parameters are predicted. The measured values are compared to the predicted values to generate residual values associated with the electrical test parameters. At least one performance metric associated with the devices is generated based on the residual values.

21 Claims, 2 Drawing Sheets

IDENTIFYING MANUFACTURING DISTURBANCES USING PRELIMINARY ELECTRICAL TEST DATA

CROSS-REFERENCE TO RELATED APPLICATIONS

Not applicable.

BACKGROUND

The disclosed subject matter relates generally to manufacturing and testing of semiconductor devices, more particularly, to identifying manufacturing disturbances using preliminary electrical test data.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost of integrated circuit devices incorporating such transistors.

Generally, a distinct sequence of processing steps is performed on a lot of wafers using a variety of processing tools, including photolithography steppers, etch tools, deposition tools, polishing tools, rapid thermal processing tools, implantation tools, etc., to produce final products that meet certain electrical performance requirements. In some cases, electrical measurements that determine the performance of the fabricated devices are not conducted until relatively late in the fabrication process, and sometimes not until the final test stage. For example, it is not uncommon for six weeks to lapse between the completion of quality significant steps and the final wafer electrical testing (FWET).

Prior to completion of the device (e.g., prior to forming the final metalization layers), a sample wafer electrical test (SWET) may be performed. SWET testing may be performed after completion of manufacturing steps that significantly impact quality of the yet to be completed devices. SWET measurements typically encompass dozens or even hundreds of parameters. It is difficult to monitor this large number of signals, and it is common to fail to identify error signals in the data. This difficulty is compounded by the fact that it is difficult to correlate the SWET disturbances to actual quality parameters in the completed device. As a result, significant signals identifying a problem may be missed, which may lead to a reduction on product quality, and resources may be expended unproductively by investigating false alarms, which increases cost and may reduce throughput.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes receiving measured values for a plurality of electrical test parameters associated with integrated circuit devices on at least one wafer measured prior to completion of the wafer. Values of the electrical test parameters are predicted. The measured values are compared to the predicted values to generate residual values associated with the electrical test parameters. At least one performance metric associated with the devices is generated based on the residual values.

Another aspect of the disclosed subject matter is seen a system including a metrology tool and a monitoring unit. The metrology tool is operable to measure values for a plurality of electrical test parameters associated with integrated circuit devices on at least one wafer measured prior to completion of the wafer. The monitoring unit is operable to predict values of the electrical test parameters, compare the measured values to the predicted values to generate residual values associated with the electrical test parameters, and generate at least one performance metric associated with the devices based on the residual values.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
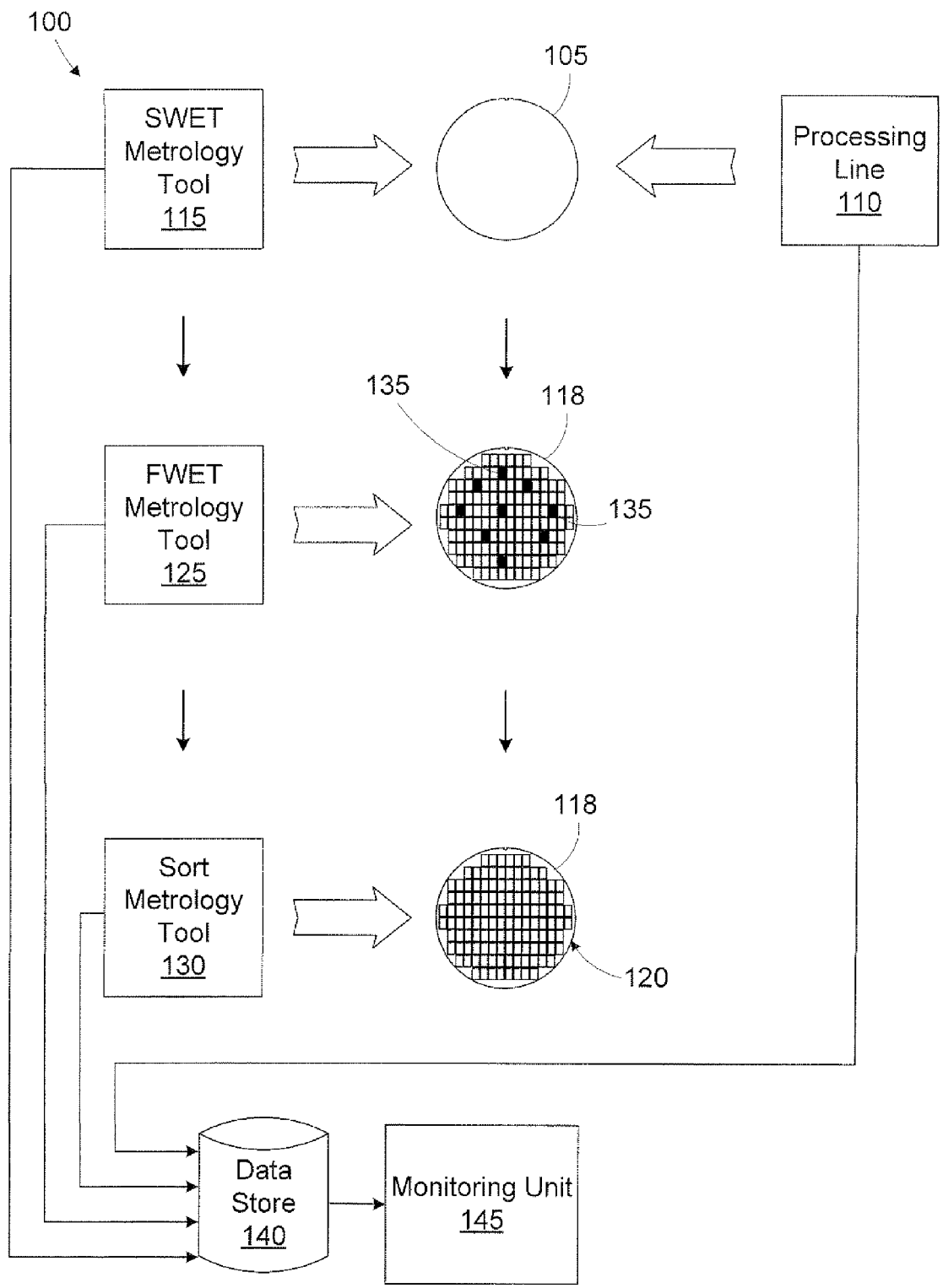
FIG. 1 is a simplified block diagram of a manufacturing system in accordance with one illustrative embodiment of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another.

Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the present subject matter are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals that are stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The present subject matter is not limited by these aspects of any given implementation.

Referring now to the drawings wherein like reference numbers correspond to similar components throughout the several views and, specifically, referring to FIG. 1, the disclosed subject matter shall be described in the context of a manufacturing system 100. The manufacturing system includes a processing line 110, one or more sample wafer electrical test (SWET) metrology tools 115, one or more final wafer electrical test (FWET) metrology tools 125, one or more SORT metrology tools 130, a data store 140, a monitoring unit 145, a sampling unit 150. In general, the monitoring unit 145 employs preliminary electrical performance data gathered by the SWET metrology tool 115 to predict performance deviations or performance characteristics that might be seen at SORT. Early deviation identification can allow more responsive corrective action.

In the illustrated embodiment, a wafer 105 is processed by the processing line 110 to fabricate a completed wafer 118 including at least partially completed integrated circuit devices, each commonly referred to as a die 120. The processing line 110 may include a variety of processing tools (not shown) and/or metrology tools (not shown), which may be used to process and/or examine the wafer 105 to fabricate the semiconductor devices. For example, the processing tools may include photolithography steppers, etch tools, deposition tools, polishing tools, rapid thermal anneal tools, ion implantation tools, and the like. The metrology tools may include thickness measurement tools, scatterometers, ellipsometers, scanning electron microscopes, and the like. Techniques for processing the wafer 105 are well known to persons of ordinary skill in the art and therefore will not be discussed in detail herein to avoid obscuring the present subject matter. Although a single wafer 105 is pictured in FIG. 1, it is to be understood that the wafer 105 is representative of a single wafer as well as a group of wafers, e.g. all or a portion of a wafer lot that may be processed in the processing line 110.

Prior to completion of the wafer, the SWET metrology tool 115 takes preliminary measurements of parameters. Generally, the SWET parameters are measured after the completion of quality significant process steps on the wafer, such as after the transistors and contacts are finished, but prior to the completion of the metal interconnect layers. SWET parameters may be measured after each metal layer; however, measuring sooner provides additional lead time before completion of the wafer 105. Exemplary SWET parameters include those useful for characterizing the transistors used in the logic/periphery and the cache. An exemplary, but not exhaustive or limiting list of SWET parameters include threshold voltage, saturation current, leakage current, gate oxide thickness, capacitance, ring oscillator speed, other parameters that describe the relationship between NMOS and PMOS devices (i.e., to gauge balance), and various resistance parameters (e.g., polysilicon, active area, buried resistor, integrated resistor, etc.).

As will be described in greater detail below, the monitoring unit 145 uses the data collected at SWET to predict the performance that is expected to be seen after the wafer 105 has completed processing and is subjected to FWET and SORT testing. These predictions allow problems with the quality significant process steps to be identified in amore timely manner, as opposed to waiting for the results from the tests performed after the fabrication is complete.

After the wafer 105 has been processed in the processing line 110 to fabricate the completed wafer 118, the wafer 118 is provided to the FWET metrology tool 125. The FWET metrology tool 125 gathers detailed electrical performance measurements for the completed wafer 118. Final wafer electrical testing (FWET) also entails parametric testing of discrete structures like transistors, capacitors, resistors, interconnects, and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them. Exemplary, but not exhaustive or limiting, FWET parameters include diode characteristics, drive current characteristics, gate oxide parameters, leakage current parameters, metal layer characteristics, resistor characteristics, via characteristics, etc. The particular FWET parameters selected may vary depending on the application and the nature of the device formed on the die.

Following FWET metrology, the wafers 118 are provided to the SORT metrology tool 130. At SORT, individual dies are tested for functionality, which is a typically much longer and more involved test sequence than SWET or FWET, especially in the case of a microprocessor. The SORT metrology tool 130 employs a series of probes to electrically contact pads on the completed die 120 to perform electrical and functional tests. For example, the SORT metrology tool 130 may measure voltages and/or currents between various nodes and circuits that are formed on the wafer 118. Exemplary SORT parameters measured include, but are not limited to, clock search parameters, diode characteristics, scan logic voltage, static IDD, VDD min, power supply open short characteristics, and ring oscillator frequency, etc. The particular SORT parameters selected may vary depending on the application and the nature of the device formed on the die. Typically, wafer SORT metrology is performed on each die 120 on the wafer 118 to determine functionality and baseline performance data.

The results of the SWET, FWET, and SORT testing may be stored in the data store 140 for further evaluation. In one embodiment of the subject matter, the monitoring unit 145 employs the SWET data to predict the impacts of disturbances on corresponding SORT parameters prior to the completion of the wafer 105 to attempt to identify manufacturing disturbances before FWET and SORT data is actually collected for a given lot or wafer after completion.

Figure 2:
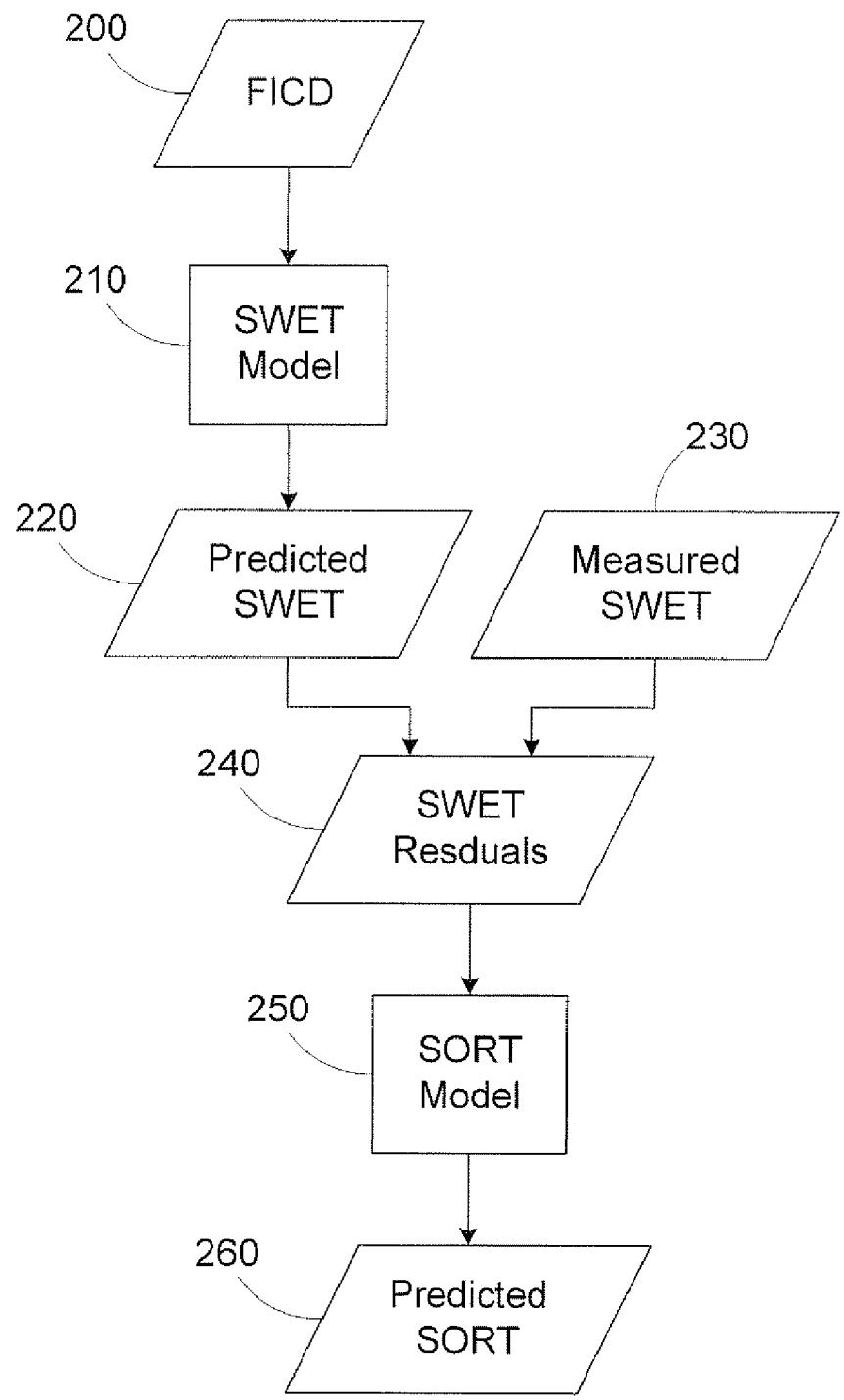
FIG. 2 is a simplified block diagram illustrating how performance deviations may be identified based on metrology data collected prior to completion of a wafer.

Referring to FIG. 2, the monitoring unit 145 employs inline metrology data 200, such as final inspection critical dimension (FICD) measurements to predict values that are expected at SWET. In one embodiment, a simple one parameter SWET model 210 may be used to predict SWET parameters 220; however, it is contemplated that more a complicated multivariate SWET model 210, such as multiple least squares regression, partial least squares regression (also referred to as projection to latent structures), principal component regression, etc., may be used to incorporate multiple input parameters in addition to or in place of FICD. For example, dopant data, stressed layer data, spacer width data, etc. may be used with the FICD data. An exemplary univariate SWET model 210 may take the form of a weighted least squares regression:

$$Y=FICD*B+C,$$

where B and C are simple linear model coefficients that are obtained based on historical data.

Subsequently, the predicted SWET parameters 220 are compared to the measured SWET parameters 230 (e.g., measured by the SWET metrology tool 115 of FIG. 1) to generate an SWET residual vector 240 that indicates the difference between the predicted and measured value for each parameter. Generally, summary statistics, such as mean or median, are determined for the lot or wafer to establish the predicted and measured SWET values 220, 230.

The SWET residual vector 240 is provided to a multivariate SORT model 250 that predicts values for various values of one or more SORT parameters 260, such as but not limited to, speed (e.g., ring oscillator speed), leakage current (i.e., commonly referred to as static $I_{DD}$), and minimum voltage (i.e., commonly referred to as $V_{DD}$ min). The output of the SORT model 250 may include residual values and/or mean values, depending on the particular implementation. Where mean values are determined, the expected mean for the device type may be determined based on historical data and combined with the predicted residuals to generate predicted mean values.

The SORT model 250 may be implemented using a partial least squares (i.e., or one of the other multivariate model types listed above) that outputs one or more SORT quality parameters indicative of the performance or performance deviation of a particular wafer 105 or lot for which SWET measurements are taken. As stated above, the SWET residuals may be provided to the SORT model 250 to allow the determination of estimated SORT residuals for the wafer or lot. SWET residuals generated by the monitoring unit 145 represent univariate inputs to the SORT model 250.

The outputs of the SORT model 250 may represent one or more SORT performance parameters, such as speed, leakage current, or minimum voltage. The outputs may represent residual values or absolute values. For example, a residual value may indicate that the device is expected to have reduced speed with respect to the historical mean for the device type, while an absolute value may factor in the historical mean and output a predicted speed for devices on the wafer.

The SORT performance metrics computed for the wafer 105 may be used for various purposes. In one embodiment, the SORT performance metrics are employed by the monitoring unit 145 to identify problems with a particular tool in the processing line 110. The monitoring unit 145 may use a control chart or other trending technique to identify a set of wafers having a SORT characteristic outside an acceptable range. The tool process histories for the suspect wafers may then be compared to identify one or more common tools that may have been used for processing the affected wafers. For example, if the static IDD SORT parameter residual indicates that devices on a group of wafers are predicted to be too hot relative to other similar wafers, the residual results may be plotted for particular implant tools in the processing line 110 to identify if a particular implant tool may require maintenance.

The SORT performance metrics may also be used to determine yield decisions for the wafer 105. If the wafer 105 diverges significantly from a particular expected value in a manner that suggests the devices on the wafer may be faulty, the wafer 105 may be scrapped before any additional resources are expended to complete the remaining process steps or to perform additional testing.

Determining the effects of deviations at SWET on SORT performance allows manufacturing disturbances to be identified sooner in the production flow. The additional delay imposed by completing and testing the wafers is avoided, allowing problem situations to be identified soon after the quality significant device fabrication steps are performed. This increased detection capability has the potential to increase the performance and profitability of the fabrication facility.

The particular embodiments disclosed above are illustrative only, as the subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the subject matter. Accordingly, the protection sought herein is as set forth in the claims below.

We claim:

1. A method for predicting performance of an integrated circuit device, comprising:
   receiving in a computing device measured values for a plurality of electrical test parameters associated with integrated circuit devices on at least one wafer measured prior to completion of the at least one wafer;
   predicting values of the electrical test parameters in the computing device based on a measured value of at least one physical characteristic of a feature formed on the at least one wafer;
   comparing the measured values in the computing device to the predicted values to generate residual values associated with the electrical test parameters, the residual values reflecting a difference between the predicted values and the measured values; and
   generating at least one performance metric associated with the devices in the computing device based on the residual values.

2. The method of claim 1, further comprising designating a problem condition with the at least one wafer based on a value of the at least one performance metric.

3. The method of claim 1, further comprising:
   generating the at least one performance metric for a plurality of wafers;
   identifying a problem condition with a subset of the wafers based on values of the at least one performance metric;
   evaluating histories of the wafers in the subset to identify a common tool used to process at least a portion of the wafers in the subset; and
   designating a problem condition with the identified common tool.

4. The method of claim 1, wherein the at least one performance metric comprises a residual performance metric indicative of a deviation of a performance characteristic of devices on the wafer from an average performance characteristic of similar devices.

5. The method of claim 1, wherein the at least one performance metric comprises at least one of a speed metric, a leakage metric, or a minimum voltage metric.

6. The method of claim 1, further comprising generating a plurality of performance metrics associated with the devices based on the residual values.

7. The method of claim 1, wherein predicting the values of the electrical test parameters comprises predicting the values of the electrical test parameters using a least squares regression model.

8. The method of claim 1, wherein the at least one physical characteristic of the feature formed on the at least one wafer comprises a gate electrode critical dimension.

9. The method of claim 1, wherein generating the at least one performance metric further comprises generating the at least one performance metric using at least one of a partial least squares regression model, a multiple least squares regression model, a projection to latent structures model, or a principal component regression model.

10. The method of claim 1, further comprising:
    generating a summary statistic for the measured values for the plurality of electrical test parameters across the at least one wafer; and
    comparing the summary statistic to the predicted values to generate the residual values.

11. A method for predicting performance of an integrated circuit device, comprising:
    receiving in a computing device measured values for a plurality of electrical test parameters associated with integrated circuit devices on a wafer measured prior to completion of the wafer;
    employing a first model in the computing device to predict values of the electrical test parameters based on a measured value of at least one physical characteristic of a feature formed on the wafer;
    comparing the measured values to the predicted values in the computing device to generate residual values associated with the electrical test parameters, the residual values reflecting a difference between the predicted values and the measured values; and
    employing a second model in the computing device to generate at least one performance metric associated with the devices based on the residual values.

12. The method of claim 11, wherein the first model comprises a univariate model, and the measured value of the at least one physical characteristic comprises a gate electrode critical dimension.

13. The method of claim 11, wherein the second model comprises a multivariate model.

14. The method of claim 11, further comprising designating a problem condition with the wafer based on a value of the at least one performance metric.

15. The method of claim 11, further comprising:
    generating the at least one performance metric for a plurality of wafers;
    identifying a problem condition with a subset of the wafers based on values of the at least one performance metric;
    evaluating histories of the wafers in the subset to identify a common tool used to process at least a portion of the wafers in the subset; and
    designating a problem condition with the identified common tool.

16. The method of claim 11, wherein the at least one performance metric comprises a residual performance metric indicative of a deviation of a performance characteristic of devices on the wafer from an average performance characteristic of similar devices.

17. The method of claim 11, wherein the at least one performance metric comprises at least one of a speed metric, a leakage metric, or a minimum voltage metric.

18. The method of claim 11, further comprising generating a plurality of performance metrics associated with the devices based on the residual values.

19. The method of claim 11, further comprising:
    generating a summary statistic for the measured values for the plurality of electrical test parameters across the wafer; and
    comparing the summary statistic to the predicted values to generate the residual values.

20. A system for predicting performance of an integrated circuit device, comprising:
    a metrology tool operable to measure values for a plurality of electrical test parameters associated with integrated circuit devices on at least one wafer measured prior to completion of the wafer; and
    a monitoring unit implemented in a computing device and operable to predict values of the electrical test parameters based on a measured value of at least one physical characteristic of a feature formed on the at least one wafer, compare the measured values to the predicted values to generate residual values associated with the electrical test parameters, the residual values reflecting a difference between the predicted values and the measured values, and generate at least one performance metric associated with the devices based on the residual values.

21. The system of claim 20, wherein the monitoring unit is operable to identify a problem condition associated with a processing line for fabricating the integrated circuit devices based on the at least one performance metric.

* * * * *